(12) United States Patent
Jiang et al.

(10) Patent No.: US 8,248,797 B2
(45) Date of Patent: Aug. 21, 2012

(54) ELECTRICAL CONTROL CABINET

(75) Inventors: Wei Jiang, Shenzhen (CN); Ya-Dong Fan, Shenzhen (CN); Zheng-Qiang Guan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 336 days.

(21) Appl. No.: 12/639,208

(22) Filed: Dec. 16, 2009

(65) Prior Publication Data

US 2011/0073279 A1    Mar. 31, 2011

(30) Foreign Application Priority Data

Sep. 29, 2009  (CN) .......................... 2009 1 0307961

(51) Int. Cl.
*H05K 7/20* (2006.01)
(52) U.S. Cl. ........ 361/696; 361/690; 361/694; 361/695; 361/701
(58) Field of Classification Search .................. 361/696
See application file for complete search history.

(56) References Cited

U.S. PATENT DOCUMENTS

| | | | | |
|---|---|---|---|---|
| 4,858,069 | A | * | 8/1989 | Hughes .......................... 361/696 |
| 5,467,250 | A | * | 11/1995 | Howard et al. ............... 361/696 |
| 6,041,851 | A | * | 3/2000 | Diebel et al. ............. 165/104.33 |
| 6,164,369 | A | * | 12/2000 | Stoller ..................... 165/104.33 |
| 6,351,381 | B1 | * | 2/2002 | Bilski et al. ................... 361/695 |
| 7,679,909 | B2 | * | 3/2010 | Spearing et al. .............. 361/699 |
| 2008/0068798 | A1 | * | 3/2008 | Hendrix et al. ............... 361/696 |

* cited by examiner

*Primary Examiner* — Gregory Thompson
(74) *Attorney, Agent, or Firm* — Altis Law Group, Inc.

(57) ABSTRACT

An electrical control cabinet includes a casing, a plurality of heat elements, a heat exchanger, and two fans. The casing includes a first receiving portion and a second receiving portion. The first receiving portion communicates outside of the casing through the heat exchanger. The fans are received in the second receiving portion. The heat elements include a plurality of first heat members received in first receiving portion and a plurality of second heat members received in the second receiving portion. The first heat members is isolated from airborne contaminants and moisture. The first heat members in the first receiving portion disperse heat by the heat exchanger, and the second heat members in the second receiving portion disperse heat by the fans.

13 Claims, 4 Drawing Sheets

ELECTRICAL CONTROL CABINET

BACKGROUND

1. Technical Field

The present disclosure generally relates to an electrical control cabinet, and particularly, to an electrical control cabinet with a heat exchanger.

2. Description of Related Art

Electrical control cabinets are often used as a periphery of many kinds of manufacturing equipments, such as CNC (computer numerical control) machines and machining centers. The electrical control cabinets contain relays, switches, and other electrical elements therein, that become sources of heat. Over time, the temperature in the electrical control cabinet can rise which could result in malfunctioning electrical elements.

A commonly used electrical control cabinet may have a fan that disperses heat from the electrical control cabinet via a vent to outside the electrical control cabinet. However, many electrical elements require isolation from airborne contaminants, impurities, and moisture.

Another type of electrical control cabinet is totally enclosed and utilizes a heat exchanger. The heat exchanger is disposed on one side of the electrical control cabinet and exchanges heat with the outside. In this electrical control cabinet, the electrical elements can be isolated from the airborne contaminants and moisture and thus, operate properly. However, all heat generated by the electrical elements is dispersed by only the heat exchanger, which may overload, resulting in the electrical elements being insufficiently cooled. Moreover, based on a maximal workload of the heat exchanger, the number of electrical elements therein may be limited.

Therefore, there is room for improvement within the art.

BRIEF DESCRIPTION OF THE DRAWINGS

The elements in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
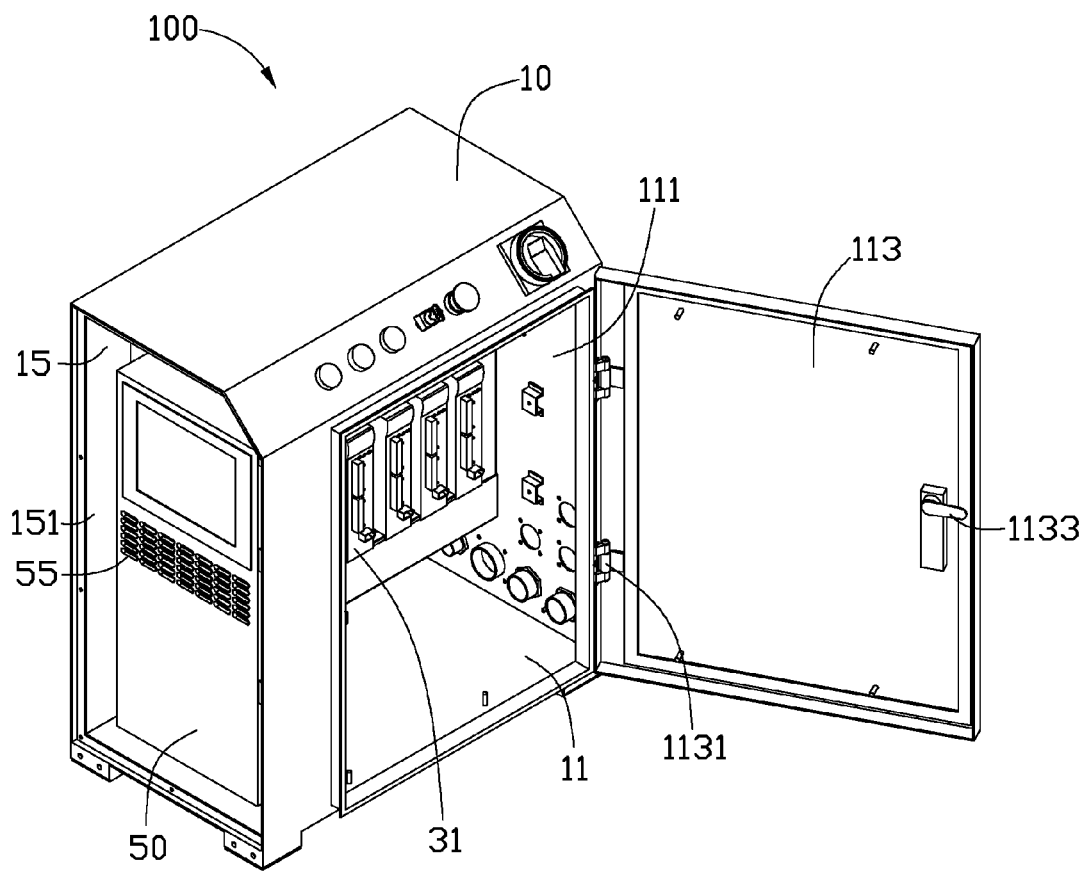
FIG. 1 is an assembled, isometric view of an embodiment of an electrical control cabinet.
Figure 2:
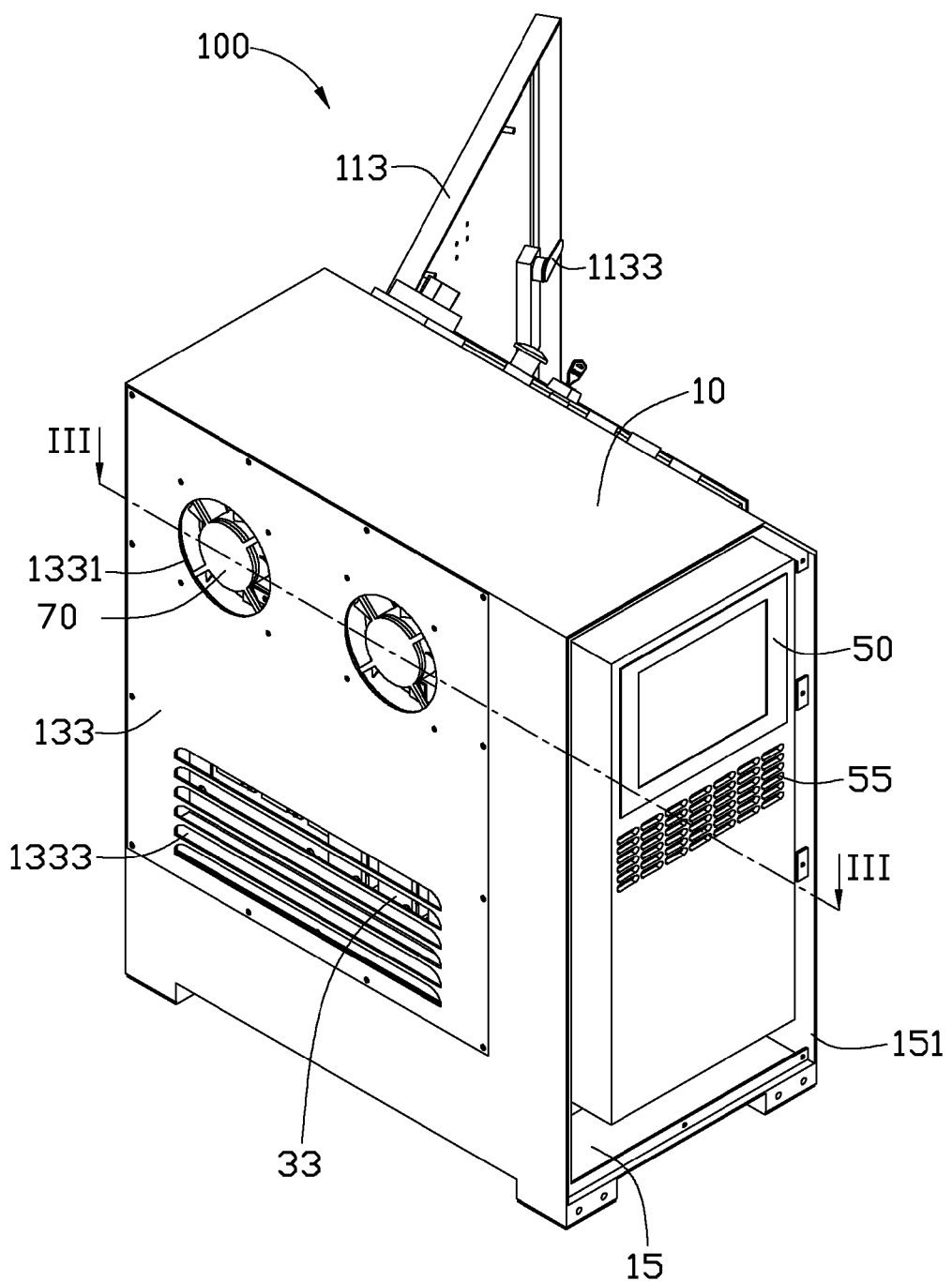
FIG. 2 is similar to FIG. 1, but viewed from another aspect.
Figure 3:
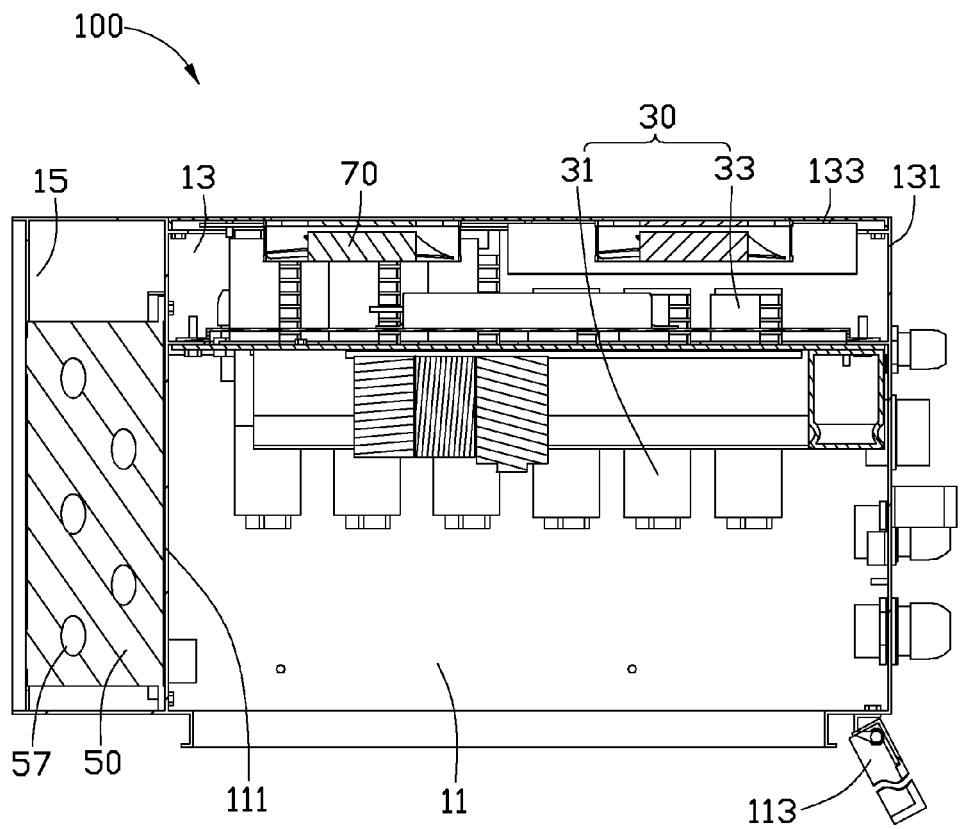
FIG. 3 is a cross-section of the electrical control cabinet of FIG. 1, taken along line III-III of FIG. 2.

The disclosed electrical control cabinet may be used for many kinds of manufacturing equipments, such as CNC (computer numerical control) machines, machining centers, and other cabinets requiring cooling, such as servers or computers. Referring to FIGS. 1 through 3, an embodiment of an electrical control cabinet 100 includes a casing 10, a plurality of heating elements 30, a heat exchanger 50, and a plurality of fans 70. The heating elements 30 and the fans 70 are disposed in the casing 10. The heat exchanger 50 is disposed on one side of the casing 10. While in the illustrated embodiment, two fans 70 are disposed, one or more than two can alternatively be used.

The casing 10 includes a first receiving portion 11, a second receiving portion 13, and a third receiving portion 15.

The first receiving portion 11 is defined by a sidewall 111 and a door 113. The first receiving portion 11 communicates with the heat exchanger 50. The door 113 includes two hinges 1131 and a locking portion 1133 adjacent to opposite sides of the door 113. One side of the door 113 is hinged on the sidewall 111 by the hinges 1131, and another side of the door 113 is fixed to the sidewall 111 by the locking portion 1133. Alternatively, more than two hinges 1131 may be used.

The second receiving portion 13 is defined by a sidewall 131 and a covering board 133 fixed on the sidewall 131. The covering board 133 defines a plurality of fixing holes 1331 and a plurality of grooves 1333. The fixing holes 1331 are configured for receiving the fans 70, which can be fixed in the fixing holes 1331 of the covering board 133. The grooves 1333 communicate the second receiving portion 13 with the outside, and contribute to heat dispersion. In the illustrated embodiment, two fixing holes 1331 are disposed, and the grooves 1333 are defined adjacent to a bottom of the casing 10 and substantially parallel to each other. The covering board 133 is fixed on the sidewall 131 with fasteners (not labeled). Alternatively, one or more than two fixing holes 1331 may be used, according to the number of fans 70. Also, one groove 1333 may be used.

The third receiving portion 15 is formed on one side of the first receiving portion 11 and the second receiving portion 13, for receiving the heat exchanger 50. The third receiving portion 15 communicates with the outside via an opening 151.

The heating elements 30 include a plurality of first heating members 31 and a plurality of second heating members 33. The first heating members 31 require isolation from airborne contaminants and moisture and are received in the first receiving portion 11 of the casing 10. The second heating members 33 do need not to be isolated from airborne contaminants and moisture and are received in the second receiving portion 13 of the casing 10. In the illustrated embodiment, six first heating members 31 and six second heating members 33 are used. The first heating members 31 can be substantially parallel to each other in the first receiving portion 11, but can be arranged in any desired fashion. The second heating members 33 are substantially parallel to each other in the second receiving portion 13, but can be arranged in any desired fashion. Alternatively, any number of the first heating members 31 and the second heating members 33 can be used.

Figure 4:
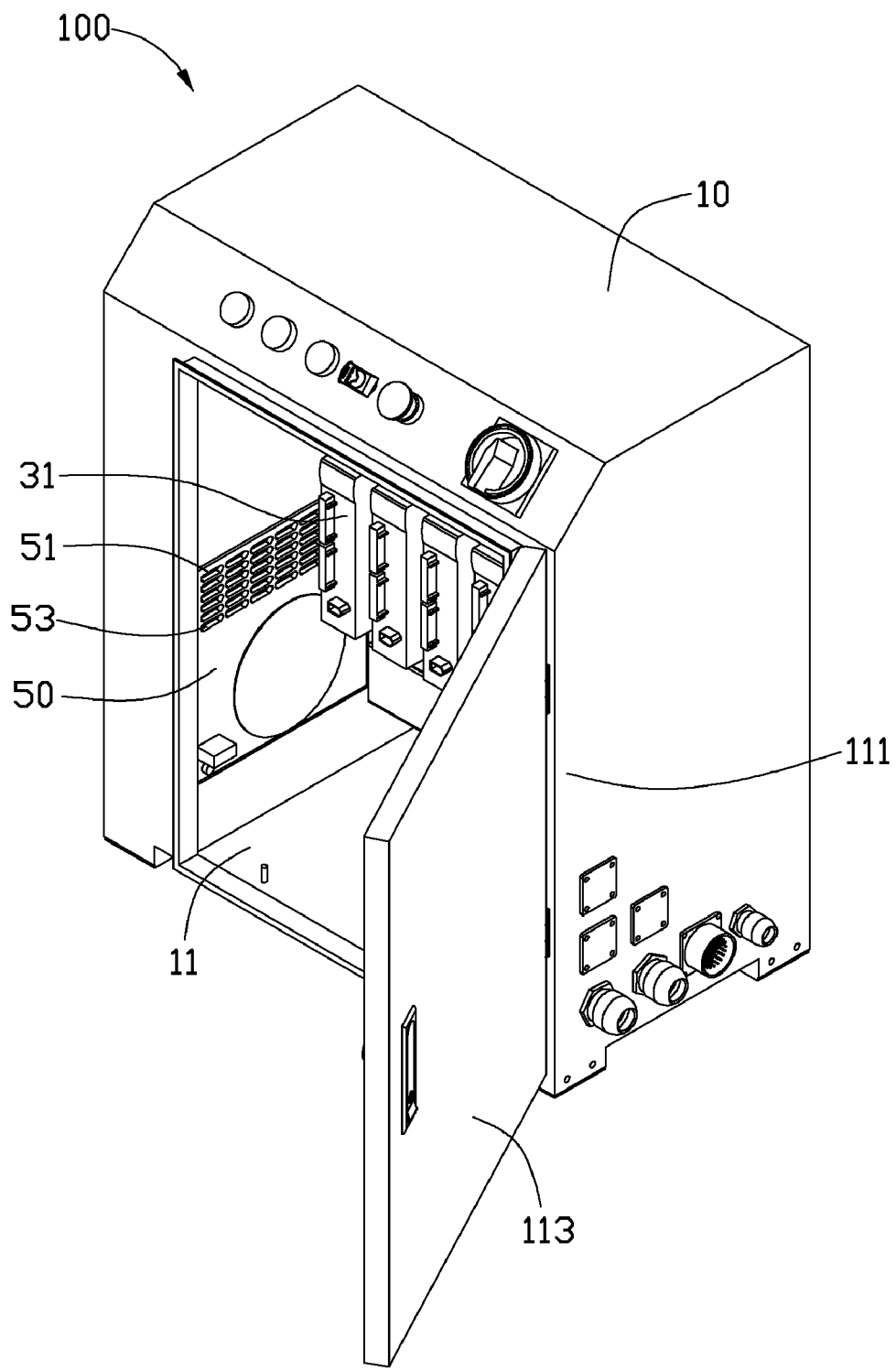
FIG. 4 is similar to FIG. 1, but viewed from yet another aspect.

Also referring to FIG. 4, the heat exchanger 50 is received in the third receiving portion 15 of the casing 10 and fixed on the sidewall 111 of the first receiving portion 11. The heat exchanger 50 includes a plurality of first vents 51, a plurality of second vents 53, and a plurality of third vents 55. The first vents 51 are defined over the second vents 53, and the third vents 55 are defined away from the first vents 51 and the second vents 53. In the illustrated embodiment, the heat exchanger 50 includes a plurality of tubes 57. One end of each tube 57 communicates with one first vent 51, and another end of each tube 57 communicates with one second vent 53. Alternatively, the heat exchanger 50 may include any desired number of the first vent 51, the second vent 53, the third vent 55, and the tube 57, for example, including one first vent 51, one second vent 53, one third vent 55, and one tube 57. The heat exchanger 50 may also be positioned on one side of the casing 10 and communicating with the first receiving portion 11 instead of being fixed on the casing 10.

The fans 70 are disposed in the second receiving portion 13 of the casing 10 and fixed on the covering board 133.

In use, the heat elements 30 in the casing 10 generate heat. The first heat members 31 in the first receiving portion 11 disperse heat by the heat exchanger 50. Since hot air is lighter than cold air, hot air enters the tubes 57 of the heat exchanger 50 via the first vents 51 and then circulates in the tubes 57, as cold air enters the first receiving portion 11 of the casing 10 via the second vents 53. The cold air outside of the casing 10 enters the heat exchanger 50 via the third vents 55 and surrounds the tubes 57 therein. Heat is dispersed by the wall of the tubes 57 and the hot air is gradually cooled while circulating in the tubes 57. When the hot air enters the first receiving portion 11 again via the second vents 53, it has been cooled. The heat exchanger 50 can be fixed on the sidewall 111 of the first receiving portion 11 by fasteners (not shown). Some refrigerant may be disposed in the tubes 57 to accelerate cooling. Alternatively, one end of each tube 57 in the heat exchanger 50 may extend to one first vent 51 or one second vent 53, and the other end of each tube 57 may extend to one third vent 55, such that hot air in the first receiving portion 11 brings heat outside of the casing 10, as cold air outside of the casing 10 enters the first receiving portion 11. In this case, desiccant and airborne contaminant removing means may be disposed in the heat exchanger 50.

The second heat members 33 in the second receiving portion 13 disperse most of the heat outside of the casing 10 through the fans 70. The rest of the heat disperses outside of the casing 10 via the grooves 1333 of the covering board 133, as cold air enters the second receiving portion 13 via the grooves 1333 to cool the second heat elements 33.

In this electrical control cabinet 100, the first heat members 31 and the second heat members 33 are received in the first receiving portion 11 and the second receiving portion 13 respectively, so that the first heat members 31 and the second heat members 33 can be cooled by multiple methods. The first heat members 31 are received in the first receiving portion 11 and merely communicate outside of the casing 10 via the heat exchanger 50, such that airborne contaminants and moisture or other impurities may not enter the first receiving portion 11, so that the first heat members 31 can work properly. The second heat members 33 are received in the second receiving portion 13 and disperse heat via the fans 70. The heat exchanger 50 needs to only disperse heat generated by some of the heat elements 30, such that the workload of the heat exchanger 50 is decreased, and the first heat members 31 in the first receiving portion 11 may be sufficiently cooled. Furthermore, since the workload of the heat exchanger 50 is lessened, more first heat members 31 can be received in the first receiving portion 11.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. An electrical control cabinet, comprising:
    a casing comprising a first receiving portion, a second receiving portion and a third receiving portion, the third receiving portion formed on one side of the first receiving portion and the second receiving portion;
    at least one first heat generating member received in the first receiving portion;
    at least one second heat generating member received in the second receiving portion; and
    a heat exchanger received in the third receiving portion and fixed on a side wall of the first receiving portion;
    wherein the first receiving portion dissipates heat out of the casing through the heat exchanger, and the second receiving portion communicates to an exterior of the casing; the heat exchanger comprises at least one first vent, at least one second vent, at least one third vent, and at least one tube assembled within the heat exchanger; each of the at least one first vent and the at least one second vent is interconnected with the first receiving portion, the at least one first vent and the at least one second vent are connected together via the at least one tube for circulating air in the first receiving portion; the at least one third vent communicates with the exterior of the casing for absorbing air into the at least one tube.

2. The electrical control cabinet of claim 1, wherein the at least one first heat member is isolated from the outside.

3. The electrical control cabinet of claim 1, further comprising at least one fan received in the second receiving portion, the at least one fan exhausting air from the second receiving portion to the outside.

4. The electrical control cabinet of claim 3, further comprising a sidewall and a covering board, the covering board defining at least one fixing hole corresponding to the at least one fan, wherein the second receiving portion is defined by the sidewall and the covering board, and the at least one fan is fixed on the covering board.

5. The electrical control cabinet of claim 4, wherein the covering board further defines at least one groove.

6. The electrical control cabinet of claim 1, further comprising at least one hinge and a door hinging on the sidewall by the at least one hinge, wherein the first receiving portion is defined by the sidewall and the door.

7. An electrical control cabinet, comprising:
    a casing comprising a first receiving portion, and a second receiving portion;
    at least one fan;
    a heat exchanger fixed on a side wall of the first receiving portion;
    at least one first heat member received in the first receiving portion, the at least one first heat member communicating to an exterior of the casing and dispersing heat through the heat exchanger; and
    at least one second heat member received in the second receiving portion and dispersing heat through the at least one fan;
    wherein, the heat exchanger comprises at least one first vent, at least one second vent, at least one third vent, and at least one tube assembled within the heat exchanger; each of the at least one first vent and the at least one second vent is interconnected with the first receiving portion, the at least one first vent and the at least on second vent are connected together via the at least one tube for circulating air in the first receiving portion; the at least one third vent communicates with the exterior of the casing for absorbing air into the at least one tube.

8. The electrical control cabinet of claim 7, wherein the at least one first heat member is isolated from the outside.

9. The electrical control cabinet of claim 7, wherein the first receiving portion communicates with the heat exchanger; and the second receiving portion receives the at least one fan and directly communicates to the exterior of the casing.

10. The electrical control cabinet of claim 9, further comprising a door hinged on the sidewall, wherein the first receiving portion is defined by the sidewall and the door.

11. The electrical control cabinet of claim 9, further comprising a sidewall and a covering board fixed on the sidewall, wherein the second receiving portion is defined by the sidewall and the covering board.

12. The electrical control cabinet of claim 11, wherein the covering board defines at least one fixing hole corresponding to the at least one fan, and the at least one fan is fixed on the covering board.

13. The electrical control cabinet of claim 12, wherein the covering board further defines at least one groove communicating the second receiving portion with the outside.

* * * * *